United States Patent
Kim et al.

(10) Patent No.: US 7,184,331 B2
(45) Date of Patent: Feb. 27, 2007

(54) REDUNDANCY FUSE CONTROL CIRCUIT AND SEMICONDUCTOR MEMORY DEVICE HAVING THE SAME AND REDUNDANCY PROCESS METHOD

(75) Inventors: Yong-Kyu Kim, Ichon-shi (KR); Sang-Hee Kang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 63 days.

(21) Appl. No.: 11/169,947

(22) Filed: Jun. 30, 2005

(65) Prior Publication Data
US 2005/0237830 A1  Oct. 27, 2005

(30) Foreign Application Priority Data
Nov. 3, 2004  (KR) .................. 10-2004-0088746

(51) Int. Cl.
*G11C 7/00* (2006.01)
(52) U.S. Cl. ............... 365/200; 365/225.7; 365/185.09
(58) Field of Classification Search ............ 365/200, 365/225.7, 185.09
See application file for complete search history.

(56) References Cited

U.S. PATENT DOCUMENTS

| | | | | |
|---|---|---|---|---|
| 5,349,556 | A * | 9/1994 | Lee | 365/200 |
| 6,373,775 | B2 * | 4/2002 | Ishikawa | 365/230.03 |
| 6,496,426 | B2 * | 12/2002 | Jeon et al. | 365/200 |
| 6,940,765 | B2 * | 9/2005 | Kyung | 365/200 |
| 2006/0002204 | A1 * | 1/2006 | Nam et al. | 365/200 |

\* cited by examiner

*Primary Examiner*—Tuan T. Nguyen
(74) *Attorney, Agent, or Firm*—Mayer Brown Rowe & Maw LLP (57) ABSTRACT

A semiconductor memory device including a fuse control circuit for providing with a plurality of fail word line addresses written in its own circuit in advance and outputting a redundancy signal representing that an input address is the same as one of the fail word line addresses, and a normal word line interruption signal, a redundancy word line controller for inputting the redundancy signal and activating a designated redundancy word line; and a normal word line controller, for activating a word line corresponding to the input word line address, which is operated or interrupted in response to the normal word line interruption signal, wherein the normal word line interruption signal has a first logic state (logic low) at a pre-charge interval or when a same address as one of the fail word line addresses is inputted, and has a second logic state (logic high) when a normal address is inputted, and the redundancy signal has a first logic state (logic low) when a same address as one of the fail word line addresses is inputted, and a second logic state (logic high) at the pre-charge interval or when an address different from the fail word line addresses is inputted.

20 Claims, 8 Drawing Sheets

REDUNDANCY FUSE CONTROL CIRCUIT AND SEMICONDUCTOR MEMORY DEVICE HAVING THE SAME AND REDUNDANCY PROCESS METHOD

FIELD OF THE INVENTION

The present invention relates to a semiconductor memory device; and, more particularly, to a structure and method for replacing fail memory cell in a semiconductor memory device.

DESCRIPTION OF RELATED ART

Figure 1:
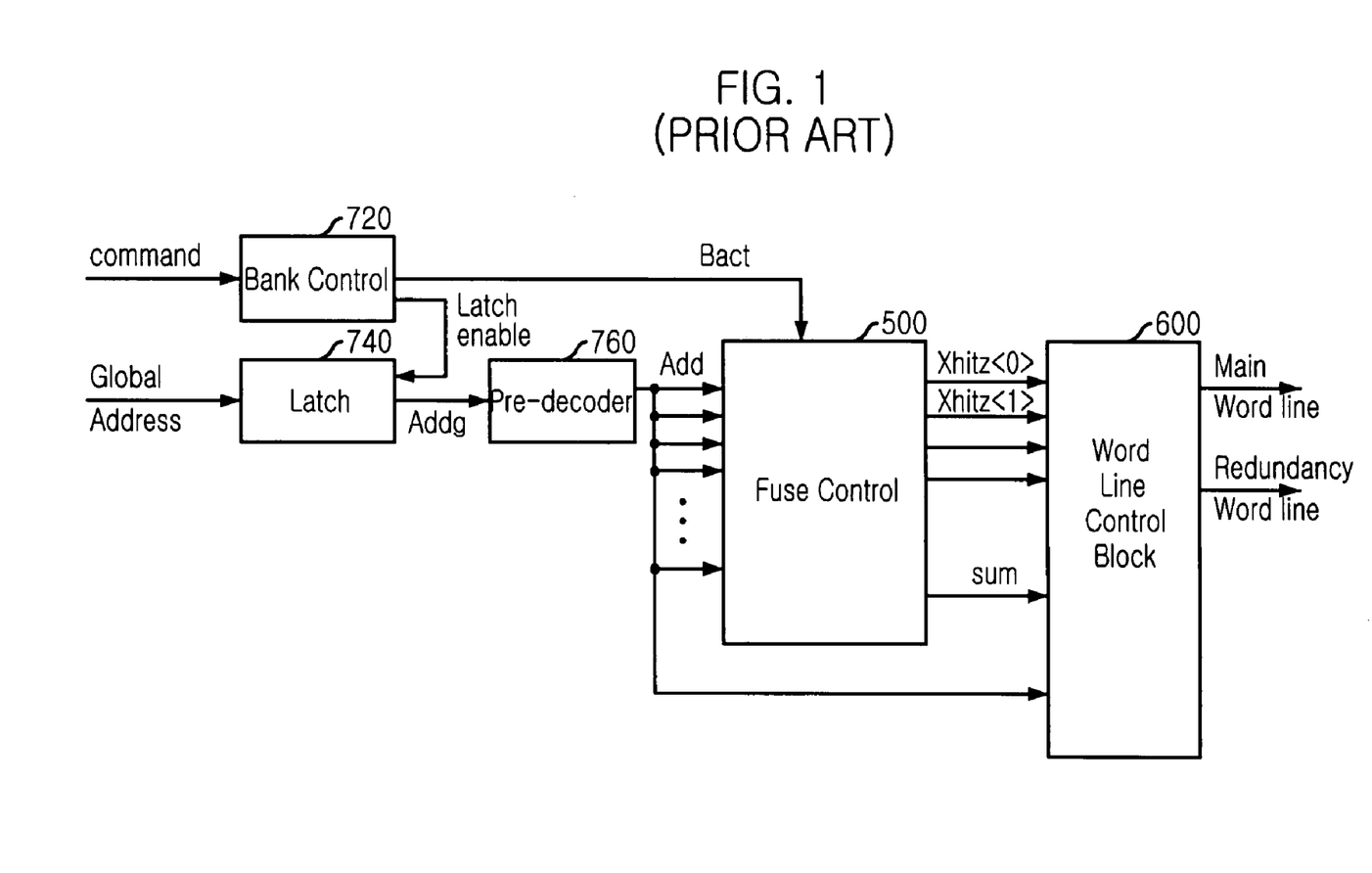
FIG. 1 is a block diagram showing a redundancy structure of a conventional semiconductor memory device.
Figure 2:
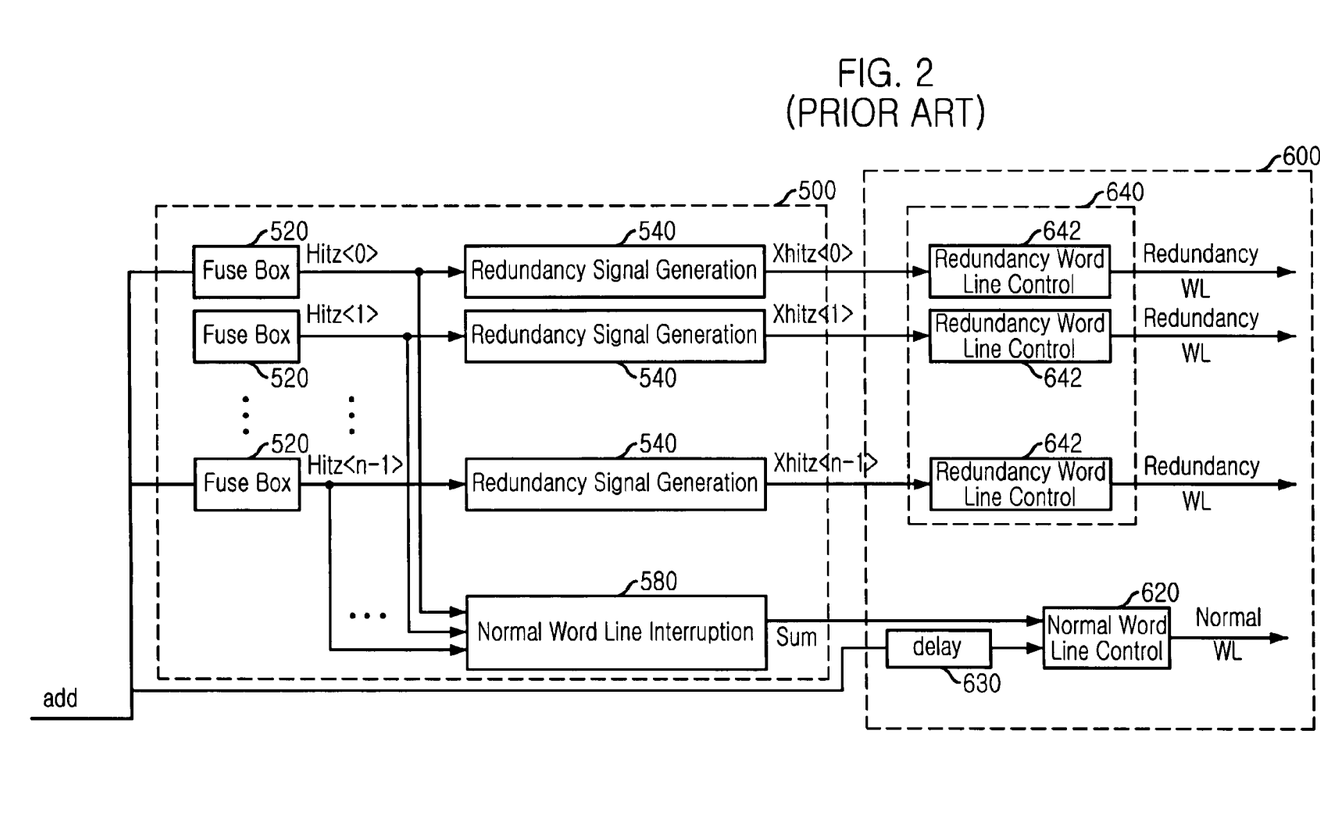
FIG. 2 is a detailed block diagram depicting a configuration of the fuse control block of redundancy structure and the redundancy control signal shown in FIG. 1.

As is well known, a semiconductor memory device is provided with redundancy cells in a certain region of its own device to replace fail cells out of memory cells of its core region. FIG. 1 is a block diagram showing a configuration of a word line control path for redundancy of a conventional semiconductor memory device, FIG. 2 depicts a detailed block diagram of a fuse control unit 500 and a word line control unit 600 among configuration blocks shown in FIG. 1, and FIG. 3 presents a concrete circuit structure of one fuse box in the configuration of FIG. 2.

Hereinafter, a redundancy process method according to the prior will be described below.

In the prior art redundancy process method, in case that there exists fail memory cell after a test of memory cells manufactured, that fail cell as well as fail cells and cells corresponding to word line address within a same bank are replaced. In other words, the general redundancy process method makes all fail word lines to be inactivated and replaces them with extra word lines. For this, word line addresses indicating word lines on which such fail cells exist are written in each fuse box 520 forming the fuse control block shown in FIG. 2. Meanwhile, addresses on fail word lines written in the fuse control block are called fail word line addresses, and spare word lines replacing word lines of fail cells are called redundancy word lines.

Figure 3:
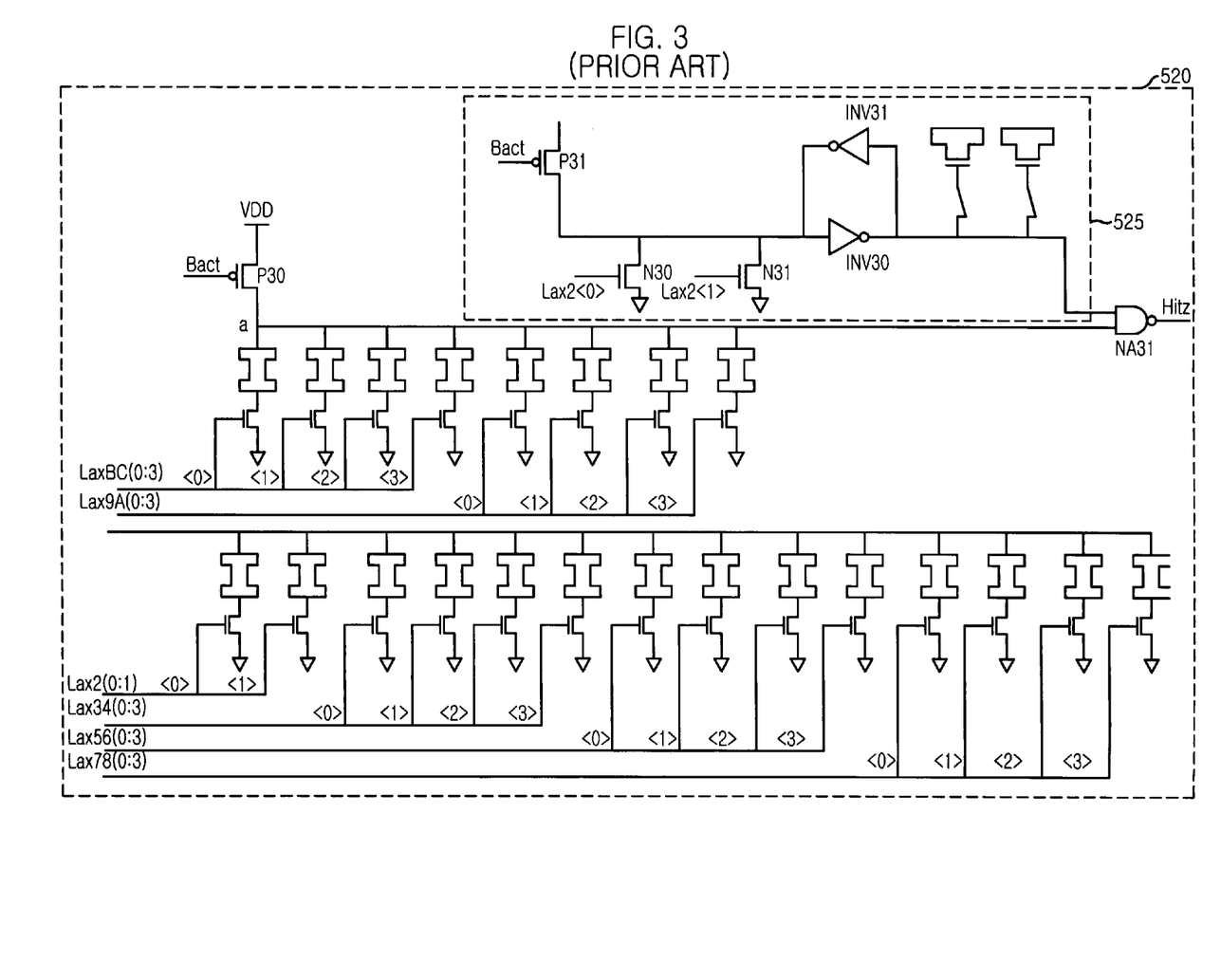
FIG. 3 is a detailed circuit diagram illustrating a circuit structure of the fuse box shown in FIG. 2.

The writing operation of fail word line address in each fuse box 520 of FIG. 3 is conducted based on whether fuse is cut or not. Each fuse box 520 shown employs 11 bits from Lax2 to LaxC, as address indicating word line, and has 2 fuses representing "0" and "1" per each one bit digit. All the fuses used herein are coupled with fuse boxes in which fail word line addresses are not written. And, the writing process of the fail word line address is made in such a way that the process of cutting one of the 2 fuses in charge of each digit according to a bit value of that digit is carried out for all the digits.

In view of the address input, driving intervals of the memory device may be classified into an addressing interval where address bus is activated and address is inputted, and a pre-charge interval (or addressing inactivating interval, or an address bus pre-charge interval) where address bus is inactivated.

During a time interval where address data is not carried on address bus, a reset signal Bact is activated at logic low for a while. The reset signal Bact activated at logic low enables a MOS transistor P30 to be turned on, thus transiting a node a to high state. Although there is not shown, the node a continues to maintain the high state by doing a latch operation to maintain such logic state at the node a itself.

If an address different from the fail word line addresses written in the fuse boxes is inputted, more than one NMOS transistor, out of 22 NMOS transistors shown in FIG. 3, is turned on and the node a is transited to low state; and the node a still maintains the high state if a same address as any one of the fail word line addresses is inputted. Thus, the node a becomes a high state at the pre-charge interval, a high state at an interval where a same address as any one of the written fail word line addresses is inputted, and a low state at an interval where a different address is inputted.

An abnormal state that needs to replace with redundancy word line occurs at an interval where a same address as any one of the written fail word line addresses is inputted, and a normal state issues at the pre-charge interval and an interval where a different address is inputted. It is desirable to provide a signal with logic state that is distinguishable only under the abnormal state; and but, such logic state is not provided at the node a. To ameliorate the problem, the prior art redundancy process method is provided with a logic state adjustor 525, which offers a signal Hitz with high state at the pre-charge interval, with low state at the interval where the written fail word line address is inputted, and with high state at the interval where non-written address is inputted.

The signal Hitz from each fuse box shown in FIG. 2 is outputted as a redundancy signal Xhitz by properly adjusting timing in each redundancy signal generation block 540. A normal word line interruption block 580 sums the redundancy signals Hitz<0> to Hitz<n-1> from all the fuse boxes 520; and outputs a normal word line interruption signal sum of logic high if a summation value is maximum one and a normal word line interruption signal sum of logic low if it is not maximum one.

The redundancy signals Xhitz<0> to Xhitz<n-1> are delivered to a redundancy word line control unit 640 that assigns each of them to each redundancy word line and decides whether each assigned redundancy word line is to be activated or not. If the normal word line interruption signal sum is logic high, a normal word line control block 620 is driven; and if the signal sum is logic low, it is interrupted.

The normal word line interruption signal sum is maintained in high state at the pre-charge interval, low state at the interval where the written fail word line address is inputted, and high state at the interval where an address other than the fail word line addresses is inputted. In this case, if the normal word line control block 620 is activated and a corresponding word line is activated due to the high level outputted at the pre-charge interval, there exists a risk that a fail word line may be activated together at an interval of making a redundancy word line activated. In order to prevent this risk, the prior art redundancy process method delays an input of part of word line addresses to the word line control block by the pre-charge interval, wherein a configuration for this is a delay block 630 shown in FIG. 2.

In the prior art redundancy process method, however, since addresses are always inputted via the delay block 630, even when accessing to normal word lines other than redundancy word lines, there exists a problem that makes addressing on the normal word lines delayed unnecessarily. Moreover, the general redundancy process method results in much delay time in decoding the normal word lines of larger number, compared to decoding the redundancy word lines of smaller number.

Further, in case of a logic state adjustor 525 shown in FIG. 3, there is used address Lax2 to decide whether or not it is the pre-charge interval. However, since the same address Lax2 is used in all the fuse boxes for the above decision, there is a problem that incurs too much load to the address line Lax2.

SUMMARY OF THE INVENTION

It is, therefore, a primary object of the present invention to provide a semiconductor memory device of redundancy structure that is capable of preventing a delay in a word line addressing path and a redundancy process method.

Another object of the present invention is to offer a semiconductor memory device of redundancy structure capable of preventing a overload that may take on an address line and a redundancy process method.

Still another object of the present invention is to provide a semiconductor memory device of redundancy structure that is capable of preventing redundancy word line and normal word line from activating simultaneously and a redundancy process method.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

In accordance with one aspect of the present invention, there is provided a semiconductor memory device comprising: a fuse control circuit for providing with a plurality of fail word line addresses written in its own circuit in advance and outputting a redundancy signal representing that an input address is the same as one of the fail word line addresses, and a normal word line interruption signal; a redundancy word line controller for inputting the redundancy signal and activating a designated redundancy word line; and a normal word line controller, for activating a word line corresponding to the input word line address, which is operated or interrupted in response to the normal word line interruption signal, wherein the normal word line interruption signal has a first logic state at a pre-charge interval or when a same address as one of the fail word line addresses is inputted, and has a second logic state when a normal address is inputted, and the redundancy signal has a first logic state when a same address as one of the fail word line addresses is inputted, and a second logic state at the pre-charge interval or when an address different from the fail word line addresses is inputted.

In accordance with another aspect of the present invention, there is provided a redundancy process method for use in a semiconductor memory device having a plurality of fuse boxes, each providing with one written fail word line address, the method comprising the steps of: (a) providing each fuse box with a redundancy detection signal with a first logic state at an interval where a same address as the fail word line address written in said each fuse box is inputted and at a pre-charge interval, and with a second logic state at an interval where a different address is inputted; (b) generating a normal word line enable signal with a first logic state at an interval where a same address as one of the written fail word line addresses is inputted and at the pre-charge interval, and with a second logic state at an interval where a normal address is inputted; (c) outputting a redundancy signal, corresponding to each redundancy detection signal, with a second logic state at the pre-charge interval and with a same logic state as the corresponding redundancy detection signal at intervals other than the pre-charge interval; (d) activating, if the normal word line enable signal has the second logic state at the step (b), a normal word line corresponding to the inputted address; and (e) activating, if one redundancy signal has the first logic state at the step (c), a redundancy word line corresponding to said one redundancy signal.

Hereinafter, preferred embodiments of the present invention will be explained in detail with reference to the accompanying drawings. First of all, it should be noted that the terms and words adopted in the specification and claims should be interpreted as meanings and concepts which coincide with the technical spirit of the present invention under the principle that the inventor(s) can properly define the concept of the terms to explain the invention in the best manner themselves, without limiting to general or dictionary meanings. Accordingly, the embodiments disclosed herein and structures shown in the drawings are merely the most preferred embodiments of the present invention, without teaching the technical spirit of the present invention. Therefore, those in the art will appreciate that various modifications, substitutions and equivalences are possible, without departing from the scope and spirit of the invention as disclosed in the accompanying claims.

Figure 4:
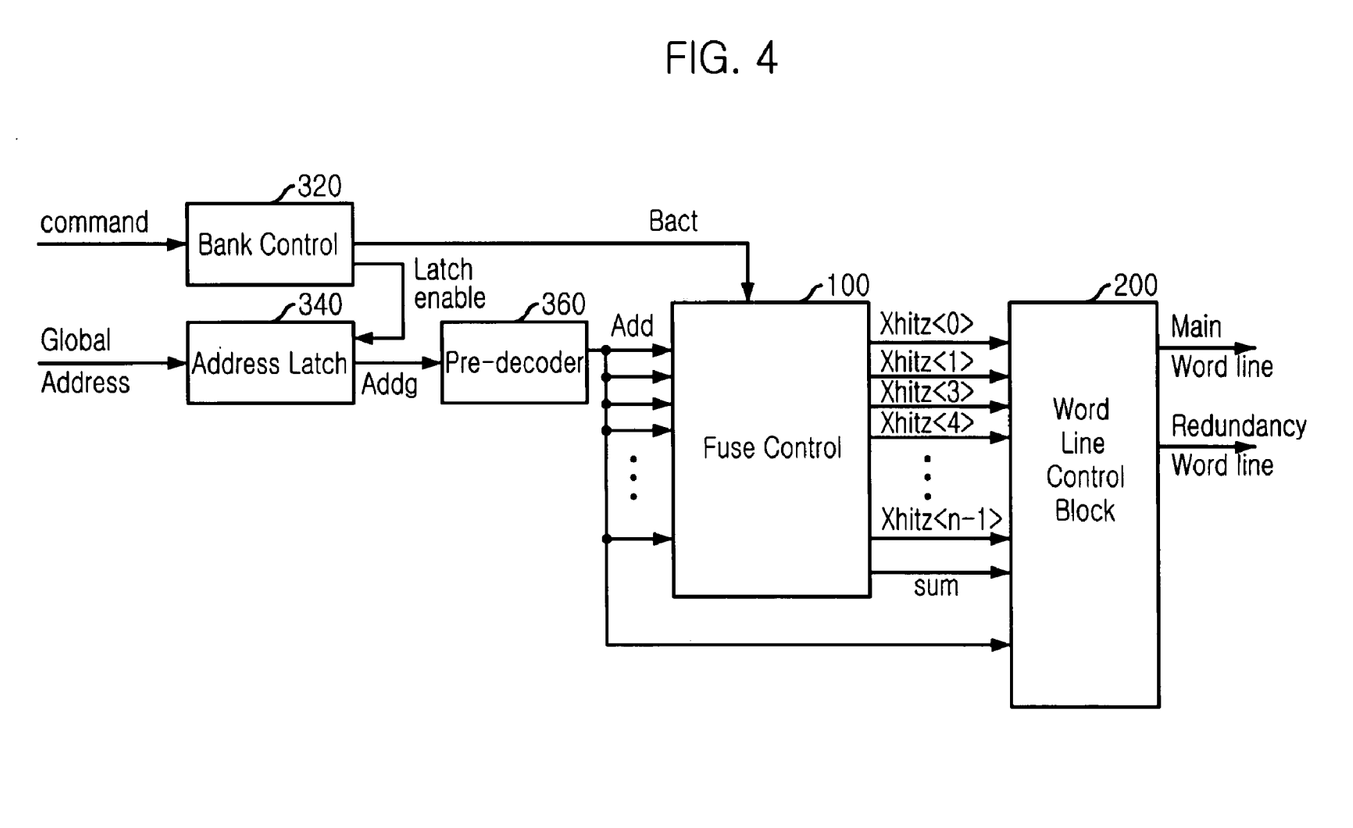
FIG. 4 is a block diagram showing a redundancy structure of a semiconductor memory device in accordance with the present invention.

A semiconductor memory device pf this embodiment shown in FIG. 4 comprises a fuse control block 100 for inputting an address indicating a position to be accessed and providing a redundancy signal Xhitz and a normal word line interruption signal sum, and a word line control block 200 for inputting the address, the redundancy signal Xhitz and the normal word line interruption signal sum and activating a proper word line corresponding to the address.

The fuse control block 100 has a set of fail word line addresses written in the block itself in advance; and first, it initializes an internal state and output values in response to a reset signal Bact and inputs the address. Then, it activates one out of redundancy signals Xhitz<0> to Xhitz<n-1> if the inputted address is identical to any one of the fail word line addresses.

The redundancy signals Xhitz<0> to Xhitz<n-1> are outputted via plural output lines, each corresponding to each written fail word line address, in which if a same address as any one of the written fail word line addresses is inputted, only a redundancy signal on a corresponding output line is activated. The word line control block 200 activates a redundancy word line if a same address as one of the written fail word line addresses is inputted; and activates a general normal word line if an address (hereinafter, called "normal address") different from the written fail word line addresses is inputted.

A bank control block 320, an address latch block 340 and a pre-decoder 360 are the same as those of the conventional semiconductor memory device. The bank control block 320 outputs a reset signal Bact, if instruction for access of read/write, etc. to memory cell is inputted, to the fuse control block 100 to reset for the address input thereto. The address latch block 340 serves to adjust operation timing of core configuration elements and address input timing, and the pre-decoder 360 decodes whole addresses to provide partial address required in each configuration element. Only the word line address is generally employed in the fuse control block 100 and the word line control block 200 of this embodiment.

Figure 5:
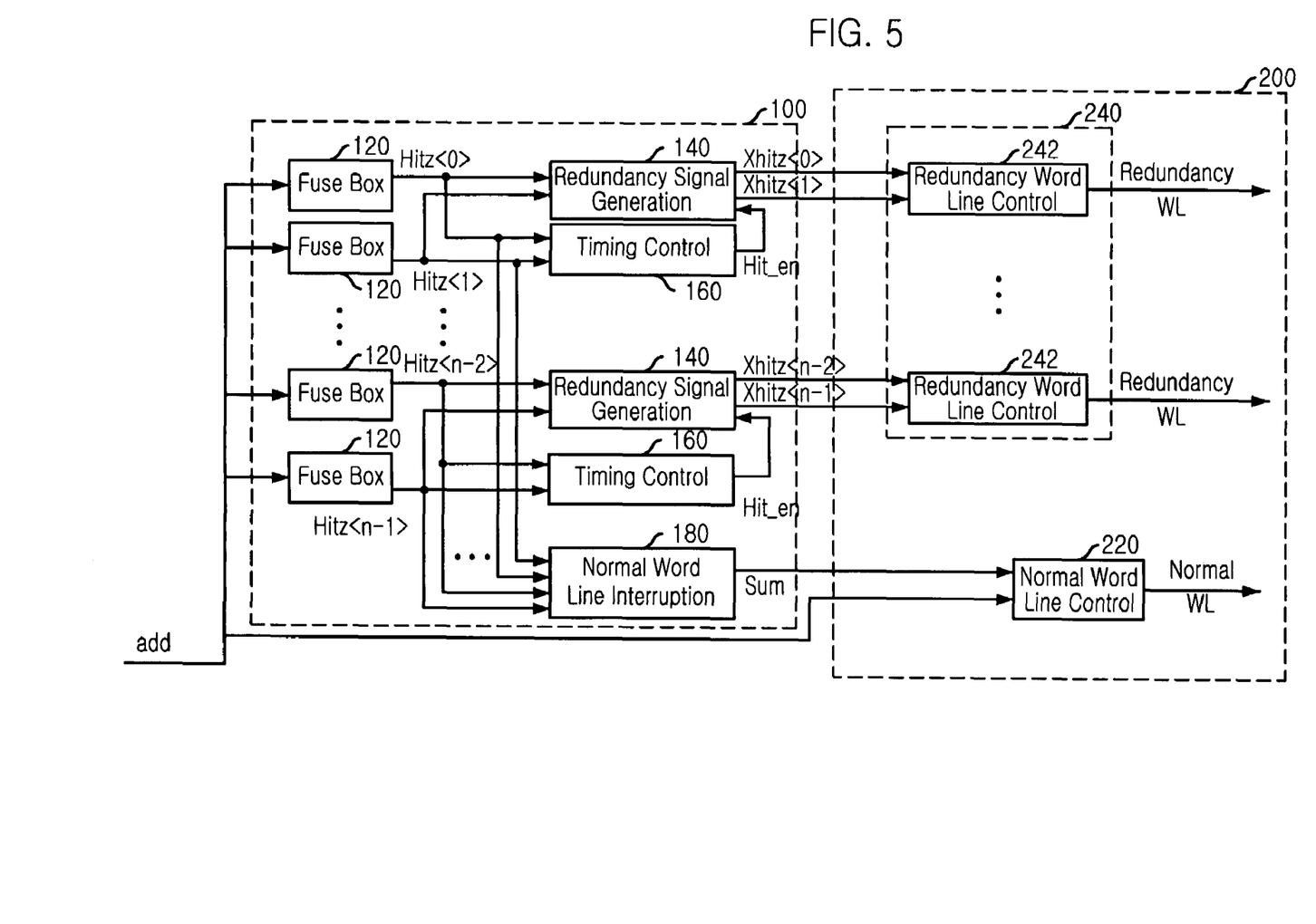
FIG. 5 is a detailed block diagram depicting a configuration of the fuse control block of redundancy structure and the redundancy control signal shown in FIG. 4.

FIG. 5 is a diagram depicting a concrete block structure of the fuse control block 100 and the word line control block 200. The fuse control block 100 shown includes more than two fuse boxes 120, each writing one fail word line address using a cutting shape of a fuse and outputting a redundancy detection signal with first logic state (here, logic low) at a pre-charge interval and at an interval where a written fail word line address is inputted, and with second logic state (here, logic high) at an interval where an address different from the written fail word line address is inputted, a timing control block 160 for inputting more than 2 redundancy detection signals from the more than 2 fuse boxes 120 and outputting an addressing enable signal Hit_en representing whether or not it is the pre-charge interval, a normal word line interruption block 180 for generating a normal word line interruption signal sum with first logic state (logic low) at the pre-charge interval and at an interval where a same address as the fail word line address written in one of the fuse boxes is inputted, and with second logic state (logic high) at an interval where a normal address is inputted; and a redundancy signal generation block 140 for generating a redundancy signal Xhitz with first logic state (logic low) at an interval where a same address as the written fail word line address is inputted, and with second logic state (logic high) at the pre-charge interval and at an interval where an address different from the written fail word line address is inputted.

As shown, the fuse control block 100 includes a plurality of fuse boxes 120, each writing one fail word line address and inputting an address Add from the pre-decoder 360 and the reset signal Bact from the bank control block 320. Further, each fuse box 120 makes the redundancy detection signal Hitz to be activated, if a same address as the fail word line address written in the box itself is inputted, and outputs it to the redundancy signal generation block 140 and the timing control block 160.

Figure 8:
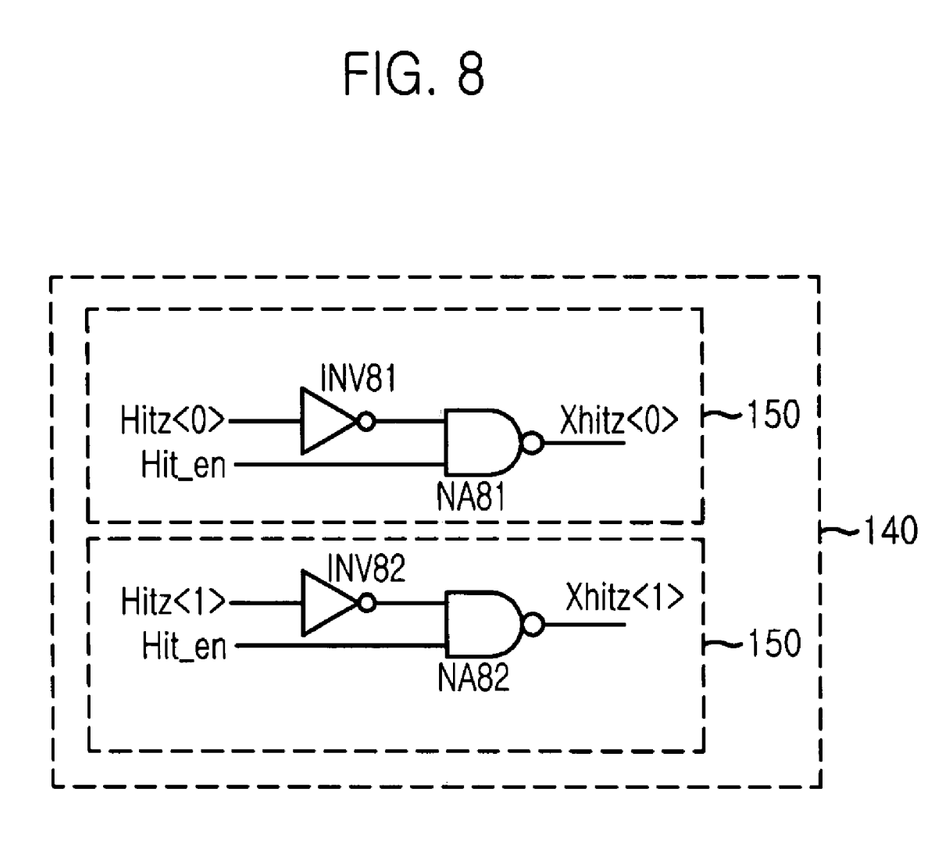
FIG. 8 is a logic circuit diagram depicting a logical structure of the redundancy signal generation block in FIG. 5.

The redundancy signal generation block 140 is arranged to assign one to each fuse box 120. Although it is shown in FIG. 5 that outputs from two fuse boxes are applied to one redundancy signal generation block 140, it should be noted that one redundancy signal generation block 140 is comprised of two separate redundancy signal generation blocks 150, as shown in FIG. 8.

Each of the redundancy detection signals Hitz<0> to Hitz<n-1> has a first logic state (logic low) at the pre-charge interval and at an addressing interval where a same address as the fail word line address written in a corresponding fuse box 120 is inputted, and has a second logic state (logic high) at an addressing interval where a different address is inputted. Each of the redundancy signals Xhitz<0> to Xhitz<n-1> has a first logic state (logic low) at an addressing interval where a same address as the fail word line address written in a corresponding fuse box 120 is inputted, and has a second logic state (logic high) at the pre-charge interval or at an addressing interval where an address different from the written fail word line address is inputted. Each redundancy signal generation block 150 functions to transform the redundancy detection signal Hitz into the redundancy signal Xhitz.

The timing control block 160 provides an addressing enable signal hit_en indicating an addressing interval for each redundancy signal generation block 150 to conduct the signal transformation operation from Hitz to Xhitz. Further, it employs 2 redundancy detection signals Hitz from the two fuse boxes 120 to determine whether or not it is the addressing interval.

The normal word line interruption block 180 is coupled with all the fuse boxes 120 to get all the redundancy detection signals Hitz<0> to Hitz<n-1>. If one of them is activated, the normal word line interruption signal sum is inactivated. The normal word line interruption block 180 sums the redundancy detection signals Hitz and provides the normal word line interruption signal sum of logic high if the summation value has maximum one, and the normal word line interruption signal sum of logic low if otherwise. But, since each redundancy detection signal Hitz has a same logic state (low level) as in the fail word line address input interval at the pre-charge interval, the normal word line interruption signal sum is also outputted as logic low level at the pre-charge interval and at an interval where one of the fail word line addresses is inputted. A detailed structure of the normal word line interruption block 180 is omitted here because it is merely an adder for the redundancy detections signals Hitz<0> to Hitz<n-1>.

The word line control block 200 is classified into a redundancy word line control unit 240 and a normal word line control block 220. The redundancy word line control unit 240 includes redundancy word line control blocks 242, whose input port is coupled with each of the redundancy signal generation blocks and output port is connected to each of the redundancy word lines, with a same number as the redundancy signal generation blocks. Each redundancy word line control block 242 may be embodied by a multiplicity of buffers and/or pass gates that are positioned between a line inputting the redundancy signal and a line outputting a signal for activating the redundancy word line and pass the redundancy signal to the redundancy word line.

The normal word line control block 220 is nearly identical to a word line control block in a memory device with no redundancy function. The normal word line control block 220 is activated when the normal word line interruption signal sum is enabled and makes a word line corresponding to the inputted address activated. Since this normal word line interruption signal sum is disabled at the pre-charge interval and at an interval where the fail word line address is inputted, the normal word line control block 220 is activated only at an interval where a same address as any one of the fail word line addresses is inputted.

Figure 6:
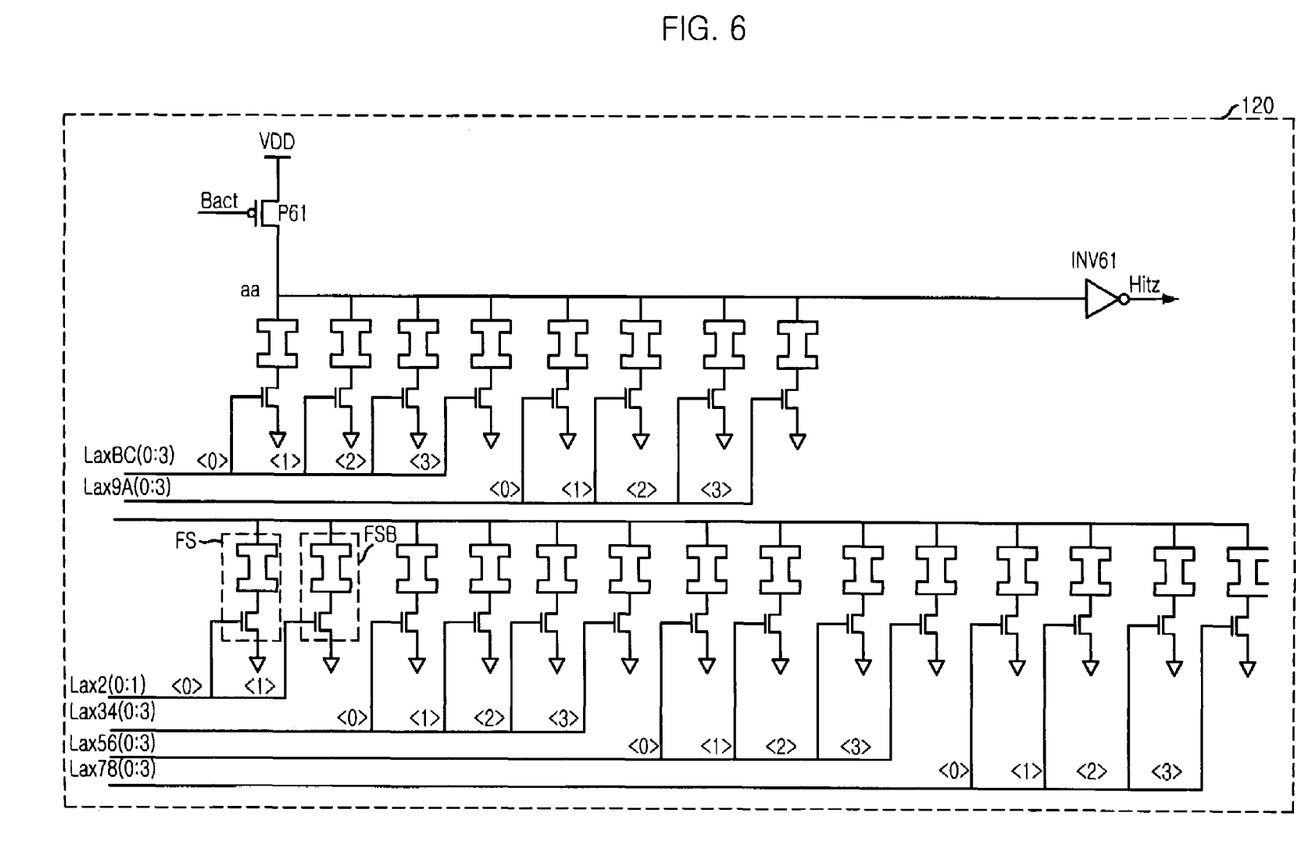
FIG. 6 is a detailed circuit diagram of a circuit structure of the fuse box depicted in FIG. 5.

The fuse box 120 of this embodiment may be implemented in a structure as shown in FIG. 6. The structure shown is that the spirit of the invention is applied to a memory bank structure where 2-bit address of $0^{th}$ digit and $1^{st}$ digit (Lax0 and Lax1) is used for bank assign, and 11 bits address from $2^{nd}$ digit to $12^{th}$ digit (Lax2 to LaxC) is utilized for word line identification, among the addresses provided from the pre-decoder 360.

The fuse box 120 shown includes a reset MOS transistor P61 whose source inputs a supply voltage and gate inputs a reset signal, a fuse provided with 2 times as large as a cipher of input word line address and connected to the drain of the reset MOS transistor P61, a pair of fuse MOS transistors, provided with the number corresponding to a cipher of the input word line address, whose source inputs the supply voltage, drain is coupled with the fuse, and gate inputs a bit value of one digit and an inverted value of the input address, and an inverter INV61 for inputting a drain voltage of the reset MOS transistor P61 and outputting a redundancy detection signal.

Two fuse switch units are assigned to one address bit and the assigned address bit (Lax2) value is inputted to one fuse switch unit FS, and an inverted value of the assigned address bit (Lax2) is applied to the remaining fuse switch unit FSB. In the above structure, the writing of the fail word line address is made by cutting one out of the 2 fuse switch units FS and FSB assigned to each digit of the fail word line address. In other words, such writing process is conducted in such a manner that the fuse of the fuse switch unit, which is turned on when the fail word line address is inputted, is cut.

For easy application to various structures of the existing memory device in accordance with the spirit of the invention, it may be preferable that only $2^{nd}$ digit (Lax2) is made as above, and the remaining digits are implemented in such a way that pairs of two digits are set, which are assigned to 4 fuse switch units, differently from the above explanation somewhat.

In the implementation, each of the two bits, e.g., 00, 01, 10, 11, is assigned to one fuse switch unit and the writing of the fail word line address is made by cutting one fuse, out of 4 fuse switch units.

The reset signal Bact is applied to the fuse box 120 in the form of logic low enable pulse, prior to an input of each address. The reset signal Bact of low state enables the reset MOS transistor P61 to be turned on, allowing a high electric potential at a node aa. If the a same address as the written fail word line address is inputted, fuses of all fuse switch units that are subject to be turned on are cut and an electric potential at the node aa has logic high. If a different address from the written fail word line address is inputted, at least one fuse switch units are turned on and an electric potential at the node aa has logic low. Thus, the redundancy detection signal Hitz that is an inverted value of the electric potential at the node aa has a logic low state (first logic state) at the pre-charge interval or when the a same address as the written fail word line address is inputted; and has a logic high state (second logic state) when a different address from the written fail word line address is inputted. For the foregoing operation, this embodiment may further comprise a buffering unit capable of storing logic states at the node aa until a next transition. Simply, it may be accomplished by implementing two inverter-latch chain of circular connection manner by an inverter INV61 that outputs the redundancy detection signal Hitz.

Figure 7:
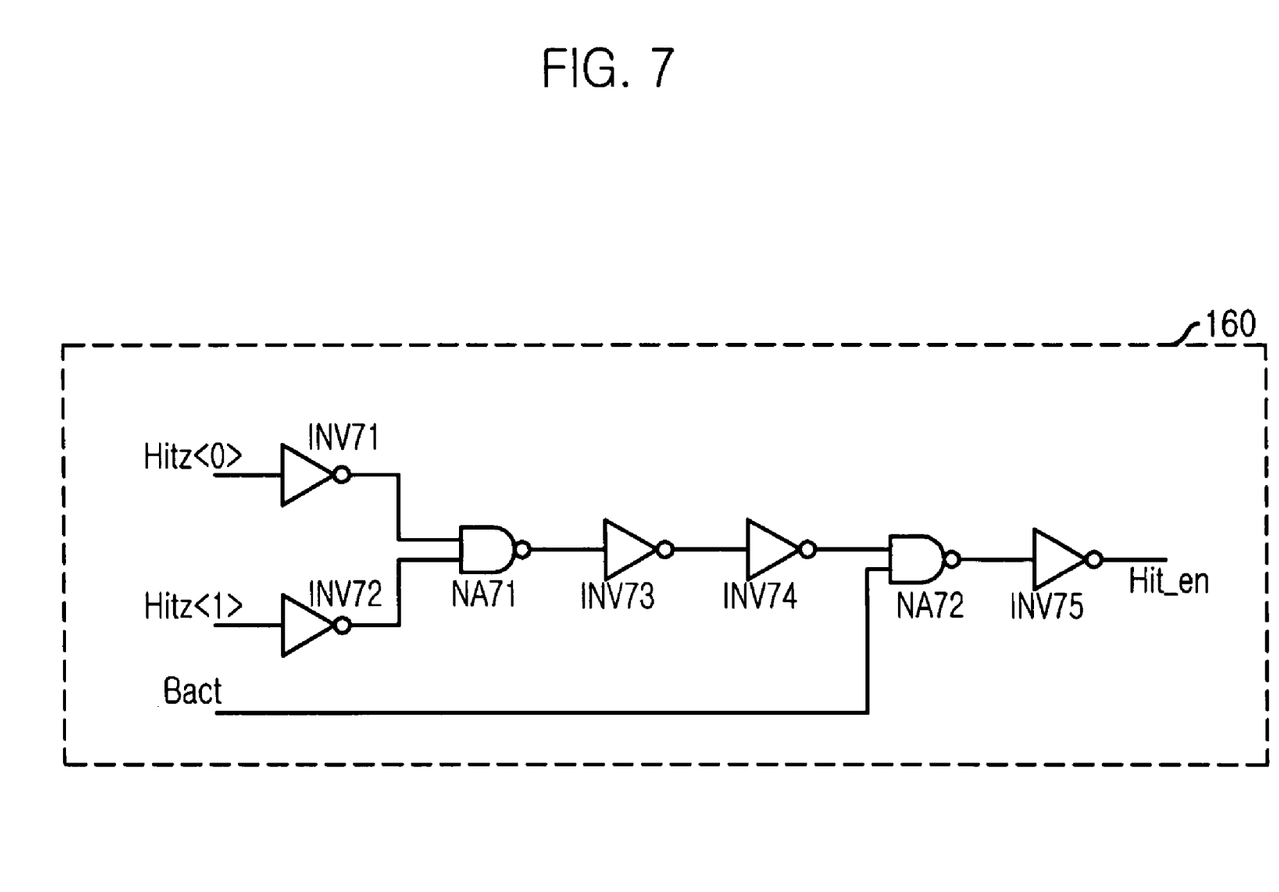
FIG. 7 is a logic circuit diagram showing a logical structure of the timing controller in FIG. 5.

The timing control block 160 of this embodiment may be of a structure as shown in FIG. 7. The timing control block 160 shown includes an OR gate for inputting the redundancy detection signals Hitz<0> to Hitz<n-1> from the more than 2 fuse boxes, and an AND gate for inputting an output from the OR gate and the reset signal Bact and providing the addressing enable signal Hit_en. The OR gate may be embodied with two inverters INV71 and INV72 for inverting the redundancy detection signals and an NAND gate NA71; and the AND gate may be embodied with an NAND gate NA72 and an inverter INV75. Further, it may further comprise two inverters INV73 and INV74 for timing adjustment.

The timing control block 160 shown makes the addressing enable signal Hit_en enabled if at lease one of two input redundancy detection signals Hitz<0> and Hitz<1> is enabled at logic high. But, when the reset signal Bact to the NAND gate NA72 is logic low, the addressing enable signal Hit_en is disabled in logic low state. The timing control block 160 employs the concept that at least one of the redundancy detection signals Hitz is in logic high state at the addressing interval, and all of them are in logic low state at the pre-charge interval. In FIG. 5, it is implemented that one timing control block 160 is prepared per two fuse boxes to minimize potential error. In order to reduce the production cost, however, it may also be embodied that only one timing control block is arranged, which controls all the redundancy signal generation blocks. In this case, the addressing enable signal Hit_en from one addressing control block is provided to all the redundancy signal generation blocks.

The redundancy signal generation block 150 of this embodiment may be a structure as shown in FIG. 8, which shows two redundancy signal generation blocks 150. Each redundancy signal generation block 150 includes an inverter INV81 for inputting the redundancy detection signal Hitz<0>, and an NAND gate NA81 for inputting an output from the inverter INV81 and the addressing enable signal Hit_en and outputting the redundancy signal Xhitz<0>. The redundancy signal Zhitz<0> outputted from the NAND gate NA81 becomes logic high state at the pre-charge interval where the addressing enable signal Hit_en is disabled, logic high state at the addressing interval where an address different from the fail word line address, which allows the redundancy detection signal Hitz<0> of logic high, is inputted, and logic low state at the addressing interval where the written fail word line address, which allows the redundancy detection signal Hitz<0> of logic low, is inputted.

A redundancy process method performed in the semiconductor memory device having the structure as set forth above is characterized that it comprises the steps of providing each fuse box 120 with a redundancy detection signal Hitz with first logic state (logic low) at an interval where a same address as a fail word line address written in each fuse box and a pre-charge interval, and with second logic state (logic high) at an interval where a difference address is inputted (S110), generating a normal word line interruption signal sum with first logic state (logic low) at an interval where a same address as one of fail word line addresses is inputted and at the pre-charge, and with second logic state at an interval where a difference address is inputted (S120), outputting a redundancy signal Xhitz, corresponding to each redundancy detection signal Hitz, with second logic state (logic high) at the pre-charge interval, and with a same logic state as the corresponding redundancy detection signal Hitz at intervals other than the pre-charge interval (S130), activating, if the normal word line enable signal is of the second logic state (logic high) at the step (S120), a normal word line corresponding to the inputted address (S140), and activating, if one redundancy signal Xhitz is of the first logic state (logic low), a redundancy word line corresponding to one redundancy signal Xhitz (S150).

The step S110 is processed by the fuse boxes 120 shown in FIG. 5 simultaneously, and the step S120 is processed by the normal word line interruption block 180 shown in FIG. 5 that inputs the redundancy detection signals Hitz. In the step S120, the normal word line interruption signal sum is created in such a way that it is decided as an interval where an address different from the fail word line addresses is inputted if a summation of the redundancy detection signals obtained at the step (S110) is maximum one; and as an interval where a same address as one of the fail word line addresses is inputted, or the pre-charge interval, if the summation value is not maximum one.

The step S130 includes the steps of inputting the two redundancy detection signals, deciding as the pre-charge interval if the two redundancy detection signals all have first logic state (logic low), and outputting an addressing enable signal enabled at intervals other than the pre-charge interval (S132), and outputting a redundancy signal with second logic state (logic high) at an inactivation interval of the addressing enable signal and with a same logic state as the redundancy detection signal at an activation interval of the addressing enable signal (S134). The step S132 is processed by the timing control block depicted in FIG. 7, and the step S134 is processed by the redundancy signal generation blocks shown in FIG. 5 simultaneously.

The step S140 is conducted at the addressing interval where a same address as one of the fail word line addresses is inputted, and the step S150 is carried out at the addressing interval where an address different from the fail word line addresses is inputted. Thus, one of the steps S140 and S150 is conducted selectively.

In accordance with the semiconductor memory device with redundancy structure of the invention, advantage is that it can prevent that both of the redundancy word line and the normal word line are activated simultaneously.

Further, the present invention also has merit that it can prevent a delay on the addressing path of the word line when the normal address is inputted.

Moreover, the invention also has advantage in that it can prevent an overload onto a specific line pf the address bus.

The present application contains subject matter related to Korean patent application No. 2004-88746, filed in the Korean Patent Office on Nov. 3, 2004, the entire contents of which being incorporated herein by reference.

While the present invention has been described with respect to the particular embodiments and drawings, it will be apparent to those skilled in the art that various changes and modifications may be made without departing from the spirit and scope of the invention as defined in the following claims.

What is claimed is:

1. A semiconductor memory device comprising:
  a fuse control circuit for providing with a plurality of fail word line addresses written in its own circuit in advance and outputting a redundancy signal representing that an input address is the same as one of the fail word line addresses, and a normal word line interruption signal;
  a redundancy word line controller for inputting the redundancy signal and activating a designated redundancy word line; and
  a normal word line controller, for activating a word line corresponding to the input word line address, which is operated or interrupted in response to the normal word line interruption signal,
  wherein the normal word line interruption signal has a first logic state at a pre-charge interval or when a same address as one of the fail word line addresses is inputted, and has a second logic state when a normal address is inputted.

2. The semiconductor memory device as recited in claim 1, wherein the redundancy signal has a first logic state when a same address as one of the fail word line addresses is inputted, and a second logic state at the pre-charge interval or when an address different from the fail word line addresses is inputted.

3. The semiconductor memory device as recited in claim 2, wherein the fuse control circuit includes more than two fuse boxes, each providing with one fail word line address written.

4. The semiconductor memory device as recited in claim 3, wherein each fuse box includes:
  a reset MOS transistor whose source inputs a supply voltage and gate inputs a reset signal;
  a fuse provided with 2 times as large as a number of cipher of the input address, each fuse being connected to the drain of the reset MOS transistor;
  a pair of fuse MOS transistors, provided with the number corresponding to a number of cipher of the input address, whose source inputs the supply voltage, drain is coupled with the fuse, and gate inputs a bit value of one digit and an inverted value of the input address; and
  an inverter for inputting a drain voltage of the reset MOS transistor and outputting a redundancy detection signal.

5. The semiconductor memory device as recited in claim 3, wherein each fuse box outputs a redundancy detection signal having a first logic state at the pre-charge interval or when a same address as the written fail word line address is inputted, and having a second logic state when a different address from the written fail word line address is inputted, and
  the fuse control circuit includes a redundancy signal generator for inputting the redundancy detection signal and outputting the redundancy signal.

6. The semiconductor memory device as recited in claim 5, wherein the fuse control circuit further includes a normal word line interruption unit for inputting the redundancy detection signal and outputting the normal word line interruption signal.

7. The semiconductor memory device as recited in claim 5, wherein the fuse control circuit further includes a timing controller for inputting the redundancy detection signals from said more than 2 fuse boxes and outputting an addressing enable signal representing whether or not it is the pre-charge interval to the redundancy signal generator.

8. The semiconductor memory device as recited in claim 5, wherein the redundancy signal generator has the same number as the number of said more than 2 fuse boxes.

9. The semiconductor memory device as recited in claim 8, wherein the redundancy word line controller includes a redundancy word line control unit, which has the same number as the number of the redundancy signal generator, whose each input port is connected to each redundancy signal generator and each output port is each redundancy word line.

10. The semiconductor memory device as recited in claim 9, wherein the redundancy word line control unit activates a redundancy word line that is connected to the unit itself when an enabled redundancy signal is inputted.

11. The semiconductor memory device as recited in claim 7, wherein the redundancy signal generator includes:
  an inverter for inputting the redundancy detection signal; and
  an NAND gate for inputting an output from the inverter and the addressing enable signal and outputting the redundancy signal.

12. The semiconductor memory device as recited in claim 7, wherein the timing controller includes:
  an OR gate for inputting the redundancy detection signals from said more than 2 fuse boxes; and
  an AND gate for inputting an output from the OR gate and the reset signal and providing the addressing enable signal.

13. A redundancy fuse control circuit comprising:

more than two fuse boxes, each providing with one written fail word line address indicating a disconnection of a fuse and outputting a redundancy detection signal with a first logic state at a pre-charge interval and at an interval where a same address as the written fail word line address is inputted, and with a second logic state at an interval where an address different from the written word line address is inputted;

a timing controller for inputting more than 2 redundancy detection signals from said more than 2 fuse boxes and outputting an addressing enable signal representing whether or not it is the pre-charge interval;

a normal word line interruption unit for generating a normal word line interruption signal with a first logic state at an interval where a same address as the fail word line address written in one of said more than 2 fuse boxes is inputted and at the pre-charge interval, and with a second logic state at an interval where a normal address is inputted; and a redundancy signal generator for generating a redundancy signal with a first logic state when a same address as the written fail word line address is inputted, and with a second logic state at the pre-charge interval or when an address different from the written word line address is inputted.

14. The redundancy fuse control circuit as recited in claim 13, wherein each fuse box includes:

a reset MOS transistor whose source inputs a supply voltage and gate inputs a reset signal;

a fuse provided with 2 times as large as a number of cipher of the input word line address, each fuse being connected to the drain of the reset MOS transistor;

a pair of fuse MOS transistors, provided with the same number as the number of a cipher of the input address, whose source inputs the supply voltage, drain is coupled with the fuse, and gate inputs a bit value of one digit and an inverted value of the input address; and an inverter for inputting a drain voltage of the reset MOS transistor and outputting the redundancy detection signal.

15. The redundancy fuse control circuit as recited in claim 13, wherein the redundancy signal generator includes:

an inverter for inputting the redundancy detection signal; and an NAND gate for inputting an output from the inverter and the addressing enable signal and outputting the redundancy signal.

16. The redundancy fuse control circuit as recited in claim 13, wherein the timing controller includes:

an OR gate for inputting the redundancy detection signals from said more than 2 fuse boxes; and an AND gate for inputting an output from the OR gate and the reset signal and providing the addressing enable signal.

17. A redundancy process method for use in a semiconductor memory device having a plurality of fuse boxes, each providing with one written fail word line address, the method comprising the steps of:

(a) providing each fuse box with a redundancy detection signal with a first logic state at an interval where a same address as the fail word line address written in said each fuse box is inputted and at a pre-charge interval, and with a second logic state at an interval where a different address is inputted;

(b) generating a normal word line enable signal with a first logic state at an interval where a same address as one of the written fail word line addresses is inputted and at the pre-charge interval, and with a second logic state at an interval where a normal address is inputted;

(c) outputting a redundancy signal, corresponding to each redundancy detection signal, with a second logic state at the pre-charge interval and with a same logic state as the corresponding redundancy detection signal at intervals other than the pre-charge interval;

(d) activating, if the normal word line enable signal has the second logic state at the step (b), a normal word line corresponding to the inputted address; and (e) activating, if one redundancy signal has the first logic state at the step (c), a redundancy word line corresponding to said one redundancy signal.

18. The method as recited in claim 17, wherein the step (b) decides as an interval where the normal address is inputted if a summation value of the redundancy detection signals obtained at the step (a) is maximum value; and as an interval where a same address as one of the written word line addresses is inputted or the pre-charge interval if the summation value is not maximum value.

19. The method as recited in claim 17, wherein the step (c) includes the steps of:

(c1) inputting more than 2 redundancy detection signals, deciding as the pre-charge interval if all the redundancy detection signals have the first logic state, and outputting an addressing enable signal disabled at the pre-charge interval; and (c2) outputting the redundancy signal with the second logic state at a disable interval of the addressing enable signal and with a same logic state as the redundancy detection signal at an enable interval of the addressing enable signal.

20. The method as recited in claim 17, wherein the steps (d) and (e) are performed selectively.

* * * * *